(12) United States Patent
Garrity et al.

(10) Patent No.: US 7,307,572 B2
(45) Date of Patent: Dec. 11, 2007

(54) PROGRAMMABLE DUAL INPUT SWITCHED-CAPACITOR GAIN STAGE

(75) Inventors: Douglas A. Garrity, Gilbert, AZ (US); Brandt Braswell, Chandler, AZ (US); David R. Locascio, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/154,416

(22) Filed: Jun. 15, 2005

(65) Prior Publication Data

US 2006/0284754 A1 Dec. 21, 2006

(51) Int. Cl.
*H03M 1/12* (2006.01)
(52) U.S. Cl. .................. 341/172; 341/122; 341/155
(58) Field of Classification Search ............ 341/172, 341/155, 163, 118, 120, 143, 173, 122; 327/337; 330/2, 9, 129
See application file for complete search history.

(56) References Cited

U.S. PATENT DOCUMENTS

| | | | | |
|---|---|---|---|---|
| 4,404,525 A | * | 9/1983 | Amir et al. | 330/9 |
| 4,438,354 A | * | 3/1984 | Haque et al. | 327/337 |
| 4,441,082 A | * | 4/1984 | Haque | 330/129 |
| 4,555,668 A | * | 11/1985 | Gregorian et al. | 330/9 |
| 5,363,102 A | * | 11/1994 | Ferguson, Jr. | 341/172 |
| 5,574,457 A | | 11/1996 | Garrity et al. | 341/172 |
| 5,625,361 A | | 4/1997 | Garrity et al. | 341/172 |
| 5,644,313 A | | 7/1997 | Rakers et al. | 341/163 |
| 5,959,565 A | * | 9/1999 | Taniuchi et al. | 341/172 |
| 6,011,433 A | * | 1/2000 | Nairn | 330/2 |
| 6,362,770 B1 | * | 3/2002 | Miller et al. | 341/172 |
| 6,400,301 B1 | * | 6/2002 | Kulhalli et al. | 341/155 |
| 6,535,157 B1 | | 3/2003 | Garrity et al. | 341/163 |
| 6,538,588 B1 | * | 3/2003 | Bazarjani | 341/143 |
| 6,624,779 B2 | * | 9/2003 | Hochschild | 341/172 |
| 6,756,929 B1 | * | 6/2004 | Ali | 341/161 |
| 6,784,824 B1 | * | 8/2004 | Quinn | 341/172 |
| 6,967,611 B2 | * | 11/2005 | Atriss et al. | 341/172 |
| 7,023,372 B1 | * | 4/2006 | Singh et al. | 341/155 |
| 7,106,204 B2 | * | 9/2006 | Pilu et al. | 340/573.1 |

* cited by examiner

*Primary Examiner*—Linh Nguyen
(74) *Attorney, Agent, or Firm*—Ingrassia Fisher & Lorenz, P.C.

(57) ABSTRACT

A switched-capacitor gain stage suitable for use with a pipelined analog to digital converter ("ADC") is capable of processing two or more input channels. The analog input voltages from the multiple channels are concurrently sampled (every other clock phase), and the gain stage processes the samples using a double sampling technique, generates residual voltage samples (every clock phase), and generates digital outputs for the multiple channels in an alternating manner. The gain stage provides equal input loading for the input stages, which enhances the performance of the ADC.

10 Claims, 5 Drawing Sheets

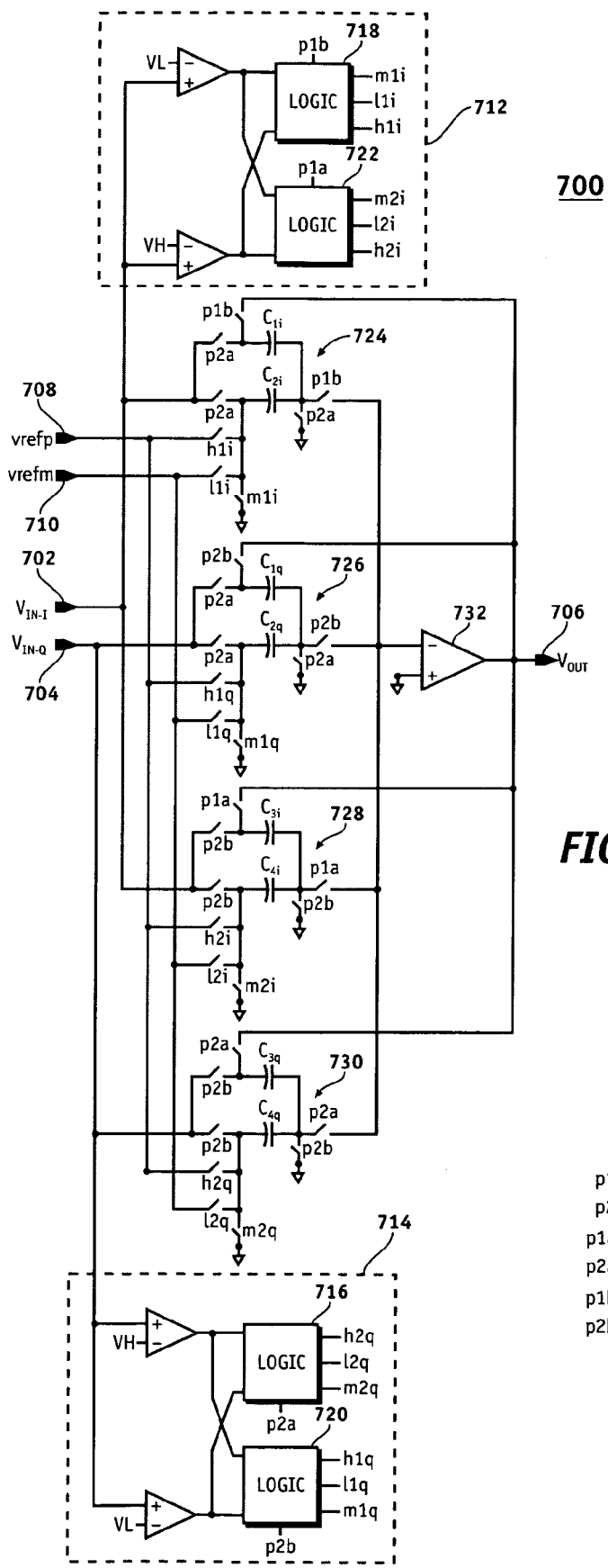
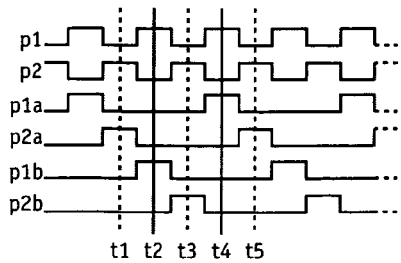
FIG. 7
FIG. 8

PROGRAMMABLE DUAL INPUT SWITCHED-CAPACITOR GAIN STAGE

CROSS-REFERENCE TO RELATED APPLICATION

The subject matter disclosed herein is related to the subject matter disclosed in U.S. patent application Ser. No. 11/154,405, filed concurrently herewith.

TECHNICAL FIELD

The present invention relates generally to electronic circuits. More particularly, the present invention relates to a switched-capacitor gain stage that is suitable for use in a pipelined analog to digital converter ("ADC").

BACKGROUND

The prior art contains a number of switched-capacitor gain stage designs. Briefly, switched-capacitor gain stages provide precisely defined gains determined by a ratio in values between capacitors, and such gain stages are typically fabricated on a single integrated circuit.

In one type of switched-capacitor gain stage, a pair of capacitors is charged in parallel across an input voltage and a ground reference. The capacitor terminals that are coupled to the ground reference are then moved to the inverting input of an operational amplifier while one of the capacitor terminals previously coupled to the input voltage is switched to the output of the amplifier and the other capacitor terminal previously coupled to the input voltage is switched to a reference voltage. When the capacitors have the same value, the output of the amplifier will then be twice the input voltage, modified by the addition or subtraction of the reference voltage (depending upon the polarity of the reference voltage). In order to increase the throughput of the gain stage, two sets of capacitor pairs may be used with one charging from the input voltage while the other is connected to the operational amplifier to produce an output value.

A rapid and precise pipelined ADC can be created by connecting a number of these equal capacitor gain stages in series. The first gain stage receives the voltage to be converted and outputs a voltage to the next gain stage for its input, and so forth. Each gain stage doubles its respective input voltage, then adds a positive voltage reference, a negative voltage reference, or zero, as determined by a comparison of the input voltage with a high voltage reference or threshold (VH) and a low voltage reference or threshold (VL). Each gain stage also produces digital conversion output bits dependent on the threshold process and the output bits from the various gain stages are combined to produce the resultant digital conversion value. A gain stage suitable for use in such an ADC is described in U.S. Pat. No. 5,574,457.

Frequently there is a need to simultaneously convert two analog signals into their digital values, for example, in electronic systems having an "in-phase" signal component and a corresponding "quadrature" signal component. Such conversions may be accomplished through the use of two distinct ADCs, but at a considerable cost and power penalty. An alternative approach is to position two sample-and-hold circuits in front of a single ADC. The sample-and-hold circuits may simultaneously sample the two input values to be presented in an interleaved sequence to a single ADC for conversion. A drawback to this latter approach, however, is that it introduces additional circuitry between the signal inputs and the ADC, which can add noise or systematic errors to the resultant digital conversion value. Further, the buffer amplifiers, timing circuitry for the interleaving, and other circuitry required by the sample-and-hold circuits significantly increase the cost of the ADC.

Another approach for a pipelined ADC, which is disclosed in U.S. Pat. No. 6,362,770, employs an initial switched-capacitor gain stage that receives two analog input signals for simultaneous sampling. The initial gain stage performs both a sample-and-hold function and a most significant bit extraction. Although the ADC disclosed in U.S. Pat. No. 6,362,770 is capable of simultaneously converting two separate input voltage signals, the configuration of the initial stage may not be suitable for all ADC applications, particularly those that require high precision, high channel isolation, and precise input channel matching.

Accordingly, it is desirable to have an improved switched-capacitor gain stage that is capable of simultaneously sampling multiple analog input channels, precisely amplifying the input signals, and generating a single output of interleaved voltage samples corresponding to the multiple input channels. Such a switched-capacitor gain stage can be utilized in a pipelined ADC, thereby saving significant chip area and reducing power consumption relative to a conventional approach that employs a plurality of distinct ADC circuits. In addition, it is desirable to have a switched-capacitor gain stage that provides improved channel isolation, input channel load balancing, and increased accuracy relative to conventional multiple input gain stages. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

FIG. 7 is a schematic representation of a switched-capacitor gain stage suitable for use in the pipelined ADC shown in FIG. 6; and FIG. 8 is a diagram depicting the relative timing of example clock signals that influence the operation of the switched-capacitor gain stage shown in FIG. 7.

DETAILED DESCRIPTION

Figure 1:
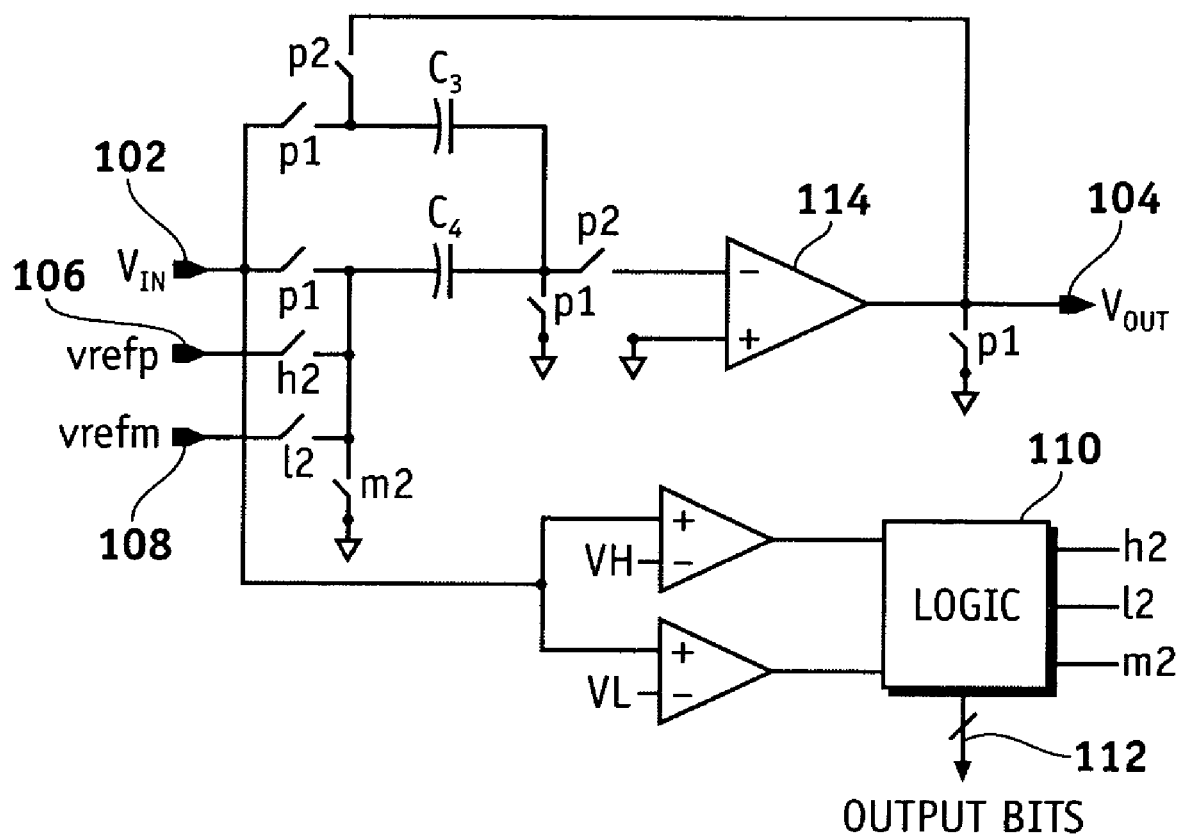
FIG. 1 is a schematic representation of an example switched-capacitor gain stage suitable for use in a pipelined ADC.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, clocks, digital logic elements, look-up tables, or the like, which may carry out a variety of functions under the control of one or more microprocessors or other control devices. In addition, those skilled in the art will appreciate that the present invention may be practiced in conjunction with any number of applications and that the ADC architectures described herein are merely example applications for the invention.

For the sake of brevity, conventional techniques related to switched capacitance gain stages, ADC architectures, voltage comparison circuits, digital logic circuits, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node/feature is directly or indirectly joined to (or is in direct or indirect communication with) another node/feature, and not necessarily physically. As used herein, unless expressly stated otherwise, "connected" means that one node/feature is directly joined to (or is in direct communication with) another node/feature. For example, a switch may be "coupled" to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

Figure 2:
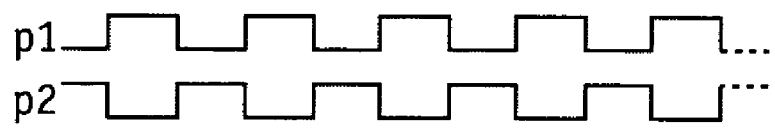
FIG. 2 is a diagram depicting the relative timing of example clock signals that influence the operation of the switched-capacitor gain stage shown in FIG. 1.

FIG. 1 is a schematic representation of an example switched-capacitor gain stage 100 suitable for use in a pipelined ADC, and FIG. 2 is a diagram depicting the relative timing of example clock signals that influence the operation of gain stage 100. Although the simplified schematic shown in FIG. 1 (and in FIGS. 3, 5, 6, and 7) is depicted in a single-ended configuration in order to simplify the explanation, a practical embodiment would be designed to be differential throughout the ADC in order to realize improved dynamic range and power supply rejection. Gain stage 100 includes an input node 102 for receiving an input voltage signal, an output node 104 for providing a voltage sample sequence that is derived from the input voltage signal, a first reference node 106 for a first reference voltage $V_{REFP}$, and a second reference node 108 for a second reference voltage $V_{REFM}$. Gain stage 100 also includes a digital logic component 110 that generates switch control signals and a digital output 112 (having any number of bits, including zero in this example).

The operation of gain stage 100 is known to those skilled in the art and, therefore, will not be described in detail herein. Briefly, the switches in gain stage 100 are controlled by the clock signals depicted in FIG. 2 and by the switch control signals generated by digital logic component 110. The switches in FIG. 1 are labeled with their respective governing clock/control signals. In this example, when a clock/control signal is high, the associated switch is closed, and when a clock/control signal is low, the associated switch is open. Thus, when the p1 clock signal is high and the p2 clock signal is low, the $C_3$ and $C_4$ capacitors charge to sample the input voltage applied to input node 102. When the p1 clock signal is low and the p2 clock signal is high, the $C_3$ and $C_4$ capacitors are coupled to an amplifier 114, which generates an output voltage at output node 104. In addition, either the h2 switch, the l2 switch, or the m2 switch is closed depending upon the comparison of the input voltage present at input node 102 relative to a high voltage reference (VH) and a low voltage reference (VL). The result of the comparison also determines the bit values for digital output 112.

If the h2 switch is closed during the gain phase (i.e., when the p1 clock signal is low and the p2 clock signal is high), then $V_{REFP}$ is subtracted from the output voltage that would otherwise be generated at output node 104. If the l2 switch is closed during the gain phase, then $V_{REFM}$ is subtracted from the output voltage that would otherwise be generated at output node 104. If the m2 switch is closed during the gain phase, then only the $C_3$ and $C_4$ capacitors contribute to the output voltage at output node 104. In a typical ADC application, $V_{REFP}$ is a positive reference voltage ($+V_{REF}$), $V_{REFM}$ is a negative reference voltage ($-V_{REF}$) having the same magnitude as $+V_{REF}$, and the $C_3$ and $C_4$ capacitors have equal capacitance. Under those conditions, the output voltage at output node 104 will be twice the input voltage at input node 102 when the m2 switch is closed, and the output voltage will be modified by the addition or subtraction of $V_{REF}$ when the l2 or h2 switches are closed.

Figure 3:
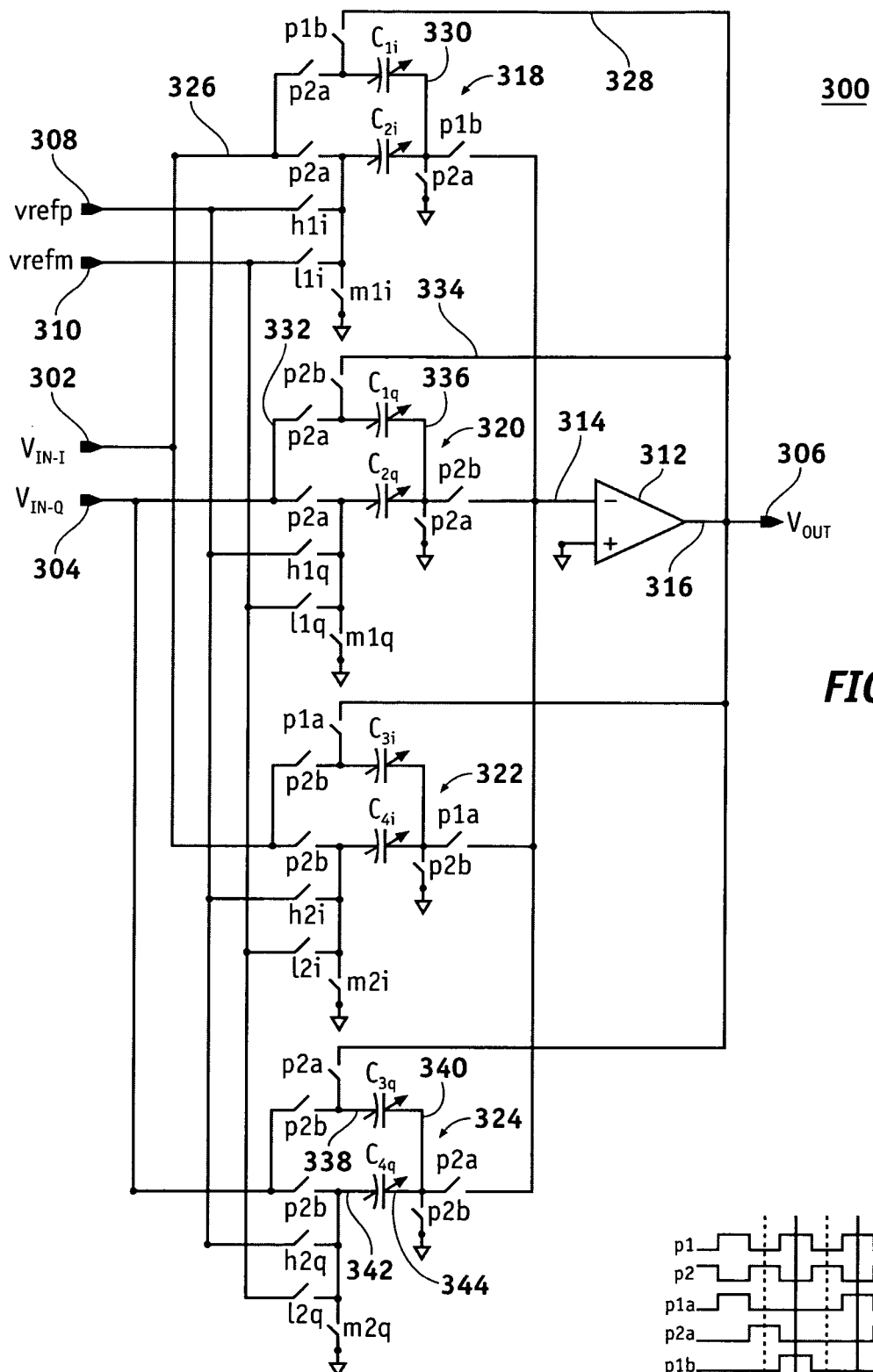
FIG. 3 is a schematic representation of a switched-capacitor gain stage configured in accordance with an example embodiment of the invention.
Figure 4:
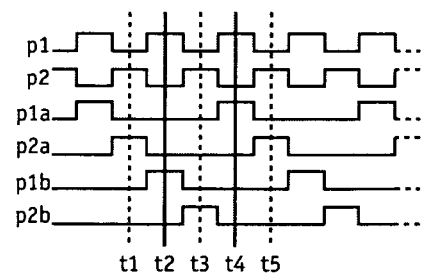
FIG. 4 is a diagram depicting the relative timing of example clock signals that influence the operation of the switched-capacitor gain stage shown in FIG. 3.

FIG. 3 is a schematic representation of a switched-capacitor gain stage 300 configured in accordance with an example embodiment of the invention, and FIG. 4 is a diagram depicting the relative timing of example clock signals that influence the operation of gain stage 300. In FIG. 4, the p1$a$, p2$a$, p1$b$, and p2$b$ signals represent clock signals or clock phases that may be based upon or derived from the p1 and p2 clock signals. As described below, these clock signals govern the operation of gain stage 300 to facilitate double sampling by gain stage 300. In this example, gain stage 300 is configured to simultaneously sample two channel inputs, to delay the processing of one channel input, and to process the two channel inputs at a double sampling rate. The invention, however, is not limited to any specific configuration and, in general, a switched-capacitor gain stage configured in accordance with an embodiment of the invention can simultaneously sample any number of channel inputs, stagger or delay the processing of the various channel inputs, and process the channel inputs at a suitable sampling rate to provide a single output of a series of interleaved output voltage samples. In practice, each input to such a gain stage would utilize two groups of capacitors (referred to herein as "capacitor arrangements") and two clock phases of the p1a/p2a variety. Thus, an example three-input gain stage would utilize a total of six capacitor arrangements and a total of six clock phases (p1a, p2a, p3a, p1b, p2b, and p3b).

Gain stage 300 includes an input node 302 for receiving a first input voltage signal (e.g., a varying analog voltage signal, a series or sequence of voltage samples generated by a previous ADC input stage, or the like), an input node 304 for receiving a second input voltage signal (e.g., a varying analog voltage signal, a series or sequence of voltage samples generated by a previous ADC input stage, or the like), and an output node 306 for providing an output voltage signal (e.g., a series or sequence of interleaved voltage samples). Although the input voltage signals can be from any suitable source, this example identifies the input voltage signals as VIN_I and VIN_Q to represent a practical embodiment that processes corresponding in-phase and quadrature signals. The series of interleaved output voltage samples is derived from the first and second input voltage signals and, more particularly, is derived from first and second voltage sample sequences that are internally generated by gain stage 300. Gain stage 300 also includes a first reference node 308 for a first reference voltage $V_{REFP}$, and a second reference node 310 for a second reference voltage $V_{REFM}$.

Gain stage 300 generally includes an amplifier 312 having an amplifier input node 314 and an amplifier output node 316, a plurality of switched-capacitor arrangements (identified by reference numbers 318, 320, 322, and 324 in FIG. 3), and a switch architecture that is suitably configured and controlled to cause gain stage 300 to concurrently sample the input voltage signals and provide, at amplifier output node 316, the series of interleaved output voltage samples. In this example, amplifier 312 is realized as an operational amplifier, amplifier input node 314 corresponds to the inverting input node for the operational amplifier, amplifier output node 316 corresponds to output node 306 of gain stage 300, and the non-inverting input node for the operational amplifier is grounded.

Generally, each switched-capacitor arrangement is coupled between an input node of gain stage 300 and amplifier input node 314, and each input node of gain stage 300 is coupled to a like number of switched-capacitor arrangements. In the example embodiment shown in FIG. 3, each of the four switched-capacitor arrangements is coupled between one of the two input nodes 302/304 and amplifier input node 314, and each input node 302/304 is coupled to two of the switched-capacitor arrangements. Specifically, switched-capacitor arrangement 318 is coupled between input node 302 and amplifier 312, switched-capacitor arrangement 320 is coupled between input node 304 and amplifier 312, switched-capacitor arrangement 322 is coupled between input node 302 and amplifier 312, and switched-capacitor arrangement 324 is coupled between input node 304 and amplifier 312.

Switched-capacitor arrangement 318 includes an input node 326 for receiving the VIN_I signal, an output node 328 coupled to amplifier output node 316, and a feedback node 330 coupled to amplifier input node 314. In this example, input node 326 corresponds to input node 302, output node 328 corresponds to output node 306, and feedback node 330 is coupled to amplifier input node 314 via a switch in the switch architecture (described in more detail below).

Switched-capacitor arrangement 320 includes an input node 332 for receiving the VIN_Q signal, an output node 334 coupled to amplifier output node 316, and a feedback node 336 coupled to amplifier input node 314. In this example, input node 332 corresponds to input node 304, output node 334 corresponds to output node 306, and feedback node 336 is coupled to amplifier input node 314 via a switch in the switch architecture. Switched-capacitor arrangement 322 is coupled within gain stage 300 as described above for switched-capacitor arrangement 318, and switched-capacitor arrangement 324 is coupled within gain stage 300 as described above for switched-capacitor arrangement 320.

In this example embodiment, each switched-capacitor arrangement includes two capacitors. Switched-capacitor arrangement 324, for example, includes a first capacitor (the $C_{3q}$ capacitor) having an input end 338 and an output end 340, and a second capacitor (the $C_{4q}$ capacitor) having an input end 342 and an output end 344. The output ends 340/344 are connected to each other and, in this example, the output ends 340/344 correspond to the output node for switched-capacitor arrangement 324. The input ends 338/342 are connected to respective switches in the switch architecture. Each switched-capacitor arrangement in gain stage 300 may be configured in a similar manner.

In one practical embodiment, gain stage 300 employs fixed capacitors throughout the switched-capacitor arrangements. For example, each switched-capacitor arrangement in gain stage 300 may include two capacitors having equal capacitance. Such a fixed configuration may be desirable in applications that do not require dynamic adjustment of gain over time. In another practical embodiment, at least one switched-capacitor arrangement includes a programmable capacitance (e.g., a variable, adjustable, or selectable capacitance). FIG. 3 depicts an embodiment where all of the capacitors in gain stage 300 are programmable capacitors. A programmable capacitance suitable for use with gain stage 300 may be realized as an array or a bank of capacitors having binary-weighted values (e.g., 2 pF, 4 pF, 8 pF, etc.), where any suitable combination can be selected using an appropriate control mechanism, such as digital control logic. Such a programmable capacitor array is disclosed in U.S. Pat. No. 5,625,361, the content of which is incorporated by reference herein. Programmable capacitances may be utilized in applications where it is desirable to vary the gain provided by the different switched-capacitor arrangements. In practice, a given capacitor may be programmed to provide different capacitances for the sampling phase and the gain phase described herein.

The switch architecture for gain stage 300 includes a plurality of switches that are suitably controlled by clock signals, switch control logic, and/or any appropriate control mechanism configured to carry out the operations described herein. For example, referring to switched-capacitor arrangement 324, the switch architecture is configured to connect input end 338 of the $C_{3q}$ capacitor and input end 342 of the $C_{4q}$ capacitor to input node 304, and to connect output end 340 of the $C_{3q}$ capacitor and output end 344 of the $C_{4q}$ capacitor to a reference potential (e.g., ground) for sampling of the VIN_Q input voltage signal. In addition, the switch architecture is configured to connect the $C_{3q}$ capacitor between amplifier input node 314 and amplifier output node 316, to connect output end 344 to amplifier input node 314, and to connect input end 342 to a reference voltage (e.g., a programmable voltage value, a fixed positive reference voltage value ($V_{REFP}$), zero, or a fixed negative reference voltage value ($V_{REFM}$)) for output voltage generation.

The operation of gain stage 300 will be summarized below with reference to the clock signals shown in FIG. 4. The switches in gain stage 300 are controlled by the clock signals depicted in FIG. 4 and by switch control signals generated by a suitably configured switch control architecture and/or by suitably configured switch control logic (not shown in FIG. 4). The switches in FIG. 3 are labeled with their respective governing clock/control signals. In this example, when a clock/control signal is high, the associated switch is closed, and when a clock/control signal is low, the associated switch is open. In FIG. 4, $t_1$ indicates the entire clock phase during which the p1 clock signal is low, the p2 clock signal is high, and the p2a clock signal is high. Likewise, the other time designators are intended to represent the respective clock phases (i.e., periods of time).

Beginning (arbitrarily) during time $t_1$, the p2 and p2a clock signals are high and the respective switches labeled p2 and p2a in FIG. 3 are closed. Concurrently, all remaining clock signals are low and all remaining switches are open. During time $t_1$, first switched-capacitor arrangement 318 and second switched-capacitor arrangement 320 are controlled such that the $C_{1i}$ and the $C_{2i}$ capacitors charge to sample the VIN_I input voltage present at input node 302 and such that the $C_{1q}$ and the $C_{2q}$ capacitors charge to sample the VIN_Q input voltage present at input node 304. Also during time $t_1$, third switched-capacitor arrangement 322 is controlled such that the $C_{3i}$ and $C_{4i}$ capacitors hold their previously-sampled voltages. The voltage holding is accomplished because the $C_{3i}$ and $C_{4i}$ capacitors are temporarily switched out of the gain stage circuit. Also during time $t_1$, fourth switched capacitor arrangement 324 is controlled such that the $C_{3q}$ and $C_{4q}$ capacitors are coupled to amplifier 312, which generates an output voltage at output node 306. This output corresponds to a previously sampled VIN_Q input voltage stored by the $C_{3q}$ and $C_{4q}$ capacitors. In addition, depending upon the particular control scheme for the switch architecture, either the h2q switch, the l2q switch, or the m2q switch is closed, thus impacting the magnitude of the output voltage present at output node 306 in a manner similar to that described above for gain stage 100. In other words, the amplifier output voltage is based upon a past-sampled voltage stored by fourth switched-capacitor arrangement 324, and based upon a selectable reference voltage (selected using the h2q switch, the l2q switch, or the m2q switch).

During a subsequent time $t_2$, the p1 and p1b clock signals are high and the respective switches labeled p1 and p1b in FIG. 3 are closed. Concurrently, all remaining clock signals are low and all remaining switches are open. During time $t_2$, the VIN_I and VIN_Q input voltage signals are not sampled. Rather, first switched-capacitor arrangement 318 is controlled such that the $C_{1i}$ and $C_{2i}$ capacitors are coupled to amplifier 312 to generate an output voltage at output node 306 corresponding to the previously sampled VIN_I input voltage stored by the $C_{1i}$ and $C_{2i}$ capacitors. In addition, depending upon the particular control scheme for the switch architecture, either the h1i switch, the l1i switch, or the m1i switch is closed, thus impacting the magnitude of the output voltage present at output node 306 in a manner similar to that described above for gain stage 100. Also during time $t_2$, second switched-capacitor arrangement 322 is controlled such that the $C_{1q}$ and $C_{2q}$ capacitors hold their previously-sampled voltages, third switched-capacitor arrangement 322 is controlled such that the $C_{3i}$ and $C_{4i}$ capacitors hold their previously-sampled voltages, and fourth switched-capacitor arrangement 324 is controlled such that the $C_{3q}$ and $C_{4q}$ capacitors hold their previously-sampled voltages.

During a subsequent time $t_3$, the p2 and p2b clock signals are high and the respective switches labeled p2 and p2b in FIG. 3 are closed. Concurrently, all remaining clock signals are low and all remaining switches are open. During time $t_3$, third switched-capacitor arrangement 322 and fourth switched-capacitor arrangement 324 are controlled such that the $C_{3i}$ and the $C_{4i}$ capacitors charge to sample the VIN_I input voltage present at input node 302 and such that the $C_{3q}$ and the $C_{4q}$ capacitors charge to sample the VIN_Q input voltage present at input node 304. Also during this time $t_3$, second switched-capacitor arrangement 320 is controlled such that the $C_{1q}$ and $C_{2q}$ capacitors are coupled to amplifier 312 to generate an output voltage at output node 306 corresponding to the previously sampled VIN_Q input voltage stored by the $C_{1q}$ and $C_{2q}$ capacitors. In addition, depending upon the particular control scheme for the switch architecture, either the h1q switch, the l1q switch, or the m1q switch is closed, thus impacting the magnitude of the output voltage present at output node 306 in a manner similar to that described above for gain stage 100. Also during time $t_3$, first switched-capacitor arrangement 318 is controlled such that the $C_{1i}$ and $C_{2i}$ capacitors hold their previously-sampled voltages.

During a subsequent time $t_4$, the p1 and p1a clock signals are high and the respective switches labeled p1 and p1a in FIG. 3 are closed. Concurrently, all remaining clock signals are low and all remaining switches are open. During time $t_4$, the VIN_I and VIN_Q input voltage signals are not sampled. Rather, third switched-capacitor arrangement 322 is controlled such that the $C_{3i}$ and $C_{4i}$ capacitors are coupled to amplifier 312 to generate an output voltage at output node 306 corresponding to the previously sampled VIN_I input voltage stored by the $C_{3i}$ and $C_{4i}$ capacitors. In addition, depending upon the particular control scheme for the switch architecture, either the h2i switch, the l2i switch, or the m2i switch is closed, thus impacting the magnitude of the output voltage present at output node 306 in a manner similar to that described above for gain stage 100. Also during time $t_4$, first switched-capacitor arrangement 318 is controlled such that the $C_{1i}$ and $C_{2i}$ capacitors hold their previously-sampled voltages, second switched-capacitor arrangement 320 is controlled such that the $C_{1q}$ and $C_{2q}$ capacitors hold their previously-sampled voltages, and fourth switched-capacitor arrangement 324 is controlled such that the $C_{3q}$ and $C_{4q}$ capacitors hold their previously-sampled voltages.

The clock phase identified by $t_5$ represents the beginning of another iteration of the procedure described above, i.e., the state of the clock signals during time $t_5$ is equivalent to the state of the clock signals during time $t_1$. Thus, the two input signals are again sampled while the output voltage will be based upon the voltages sampled by the $C_{3q}$ and $C_{4q}$ capacitors during time $t_3$. In the context of gain stage 300, the two input voltage signals VIN_I and VIN_Q are concurrently sampled every other phase of the p2 clock signal. As described above, gain stage alternately processes the input voltage samples to generate a series of interleaved output voltage samples at output node 306 on every clock phase (relative to the p1 clock signal or the p2 clock signal). In other words, although the two input voltage signals are concurrently sampled, processing of one of the two input channels is delayed to facilitate the generation of the double sampled output using only one amplifier 312.

Notably, gain stage 300 provides an equal and balanced input loading to each channel. In other words, assuming that all capacitances are equal, the load at input node 302 and the load at input node 304 are balanced at all times. As is well known in the art, balanced loads and capacitances may be critical to differential circuits and may lead to greatly improved rejection of interference and noise from the power supply and switching noise from the silicon substrate in an integrated circuit since the noise and interference signals appear as common-mode signals which are rejected by the differential circuits.

Figure 5:
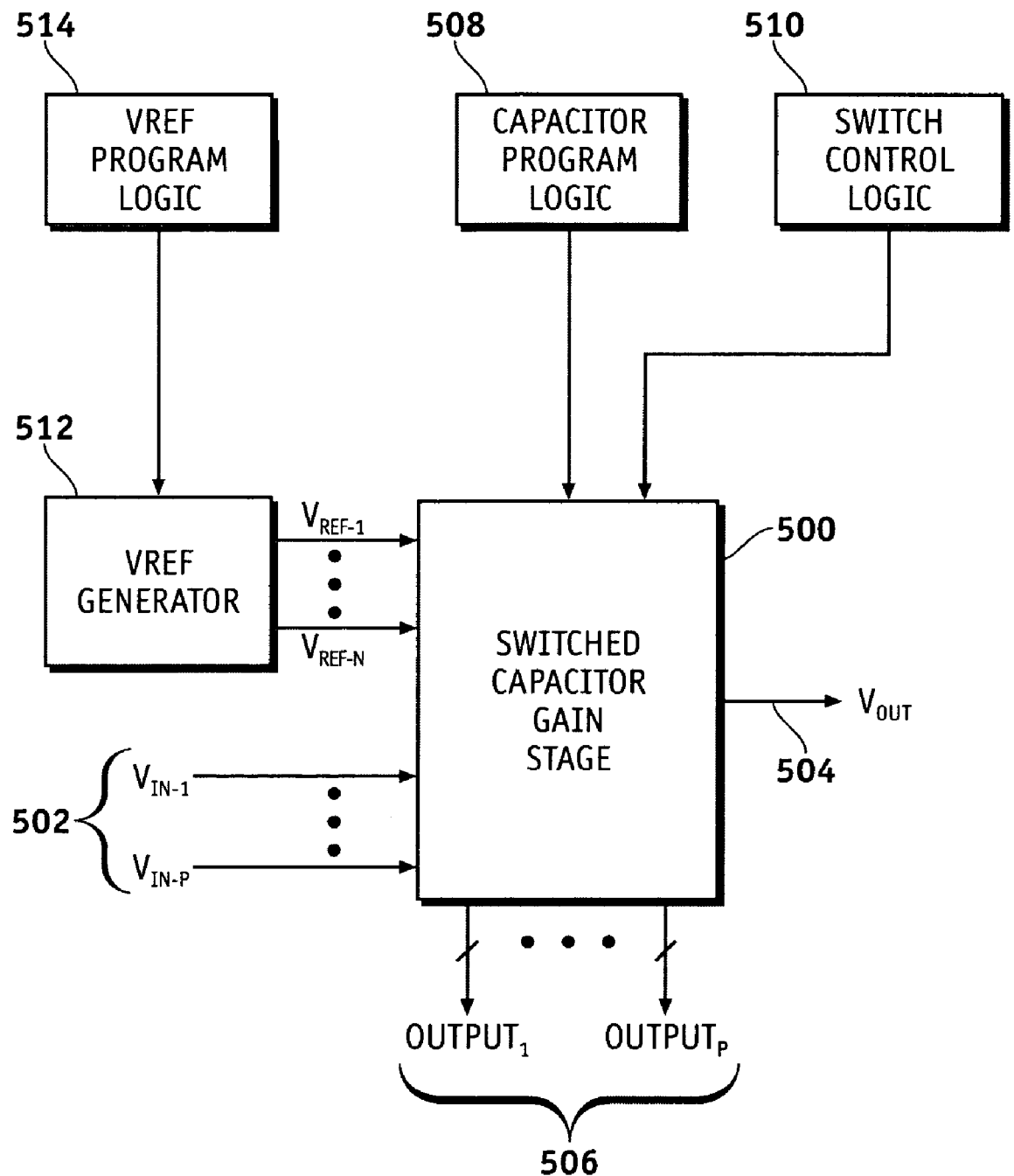
FIG. 5 is a schematic representation of a switched-capacitor gain stage and associated functional and logical components configured in accordance with an example embodiment of the invention.

FIG. 5 is a schematic representation of a switched-capacitor gain stage 500 and associated functional and logical components configured in accordance with an example embodiment of the invention. Gain stage 500 may be configured as described above for gain stage 300. Gain stage 500 is generally configured to receive any number (P) of input voltage signals 502, where P is at least two, and to generate an output 504 that includes a series of interleaved output voltage samples derived from input voltage signals 502. In this example, gain stage 500 is configured for use in a pipelined ADC. Accordingly, gain stage 500 may generate a plurality of digital outputs 506, each having any desired bit length.

Gain stage 500 may include, be coupled to, or communicate with suitably configured capacitor program logic 508 and suitably configured switch control logic 510. Capacitor program logic 508 can be utilized in embodiments having programmable or adjustable capacitors as described above in connection with gain stage 300. In this regard, capacitor program logic 508 represents the control logic that determines the programmable capacitor values and controls the timing of the capacitor programming. Switch control logic 510 represents the control logic that governs the opening and closing of at least some of the switches in the switching architecture of gain stage 500. As described above, some of the switches may be controlled with clock signals, while other switches may be controlled by other mechanisms that suit the needs of the particular application.

Gain stage 500 may also include, be coupled to, or communicate with a reference voltage generator 512 and/or suitably configured reference voltage program logic 514. As described above in connection with gain stage 300, the voltage samples of output 504 may be partially dependent on a number of reference voltage values. FIG. 5 generally depicts an arbitrary number (N) of reference voltage values available to gain stage 500. In a simple practical embodiment, gain stage 500 operates with a number of fixed reference voltage values, e.g., a positive reference voltage, a negative reference voltage, and zero. Consequently, reference voltage generator 512 may simply be a voltage supply configured to supply the desired voltage values and a ground potential to gain stage 500. In an alternate embodiment, gain stage 500 may operate with one or more programmable, adjustable, or variable reference voltages. In such an embodiment, reference voltage generator 512 may be configured to generate different reference voltage potentials under the control of reference voltage program logic 514.

Figure 6:
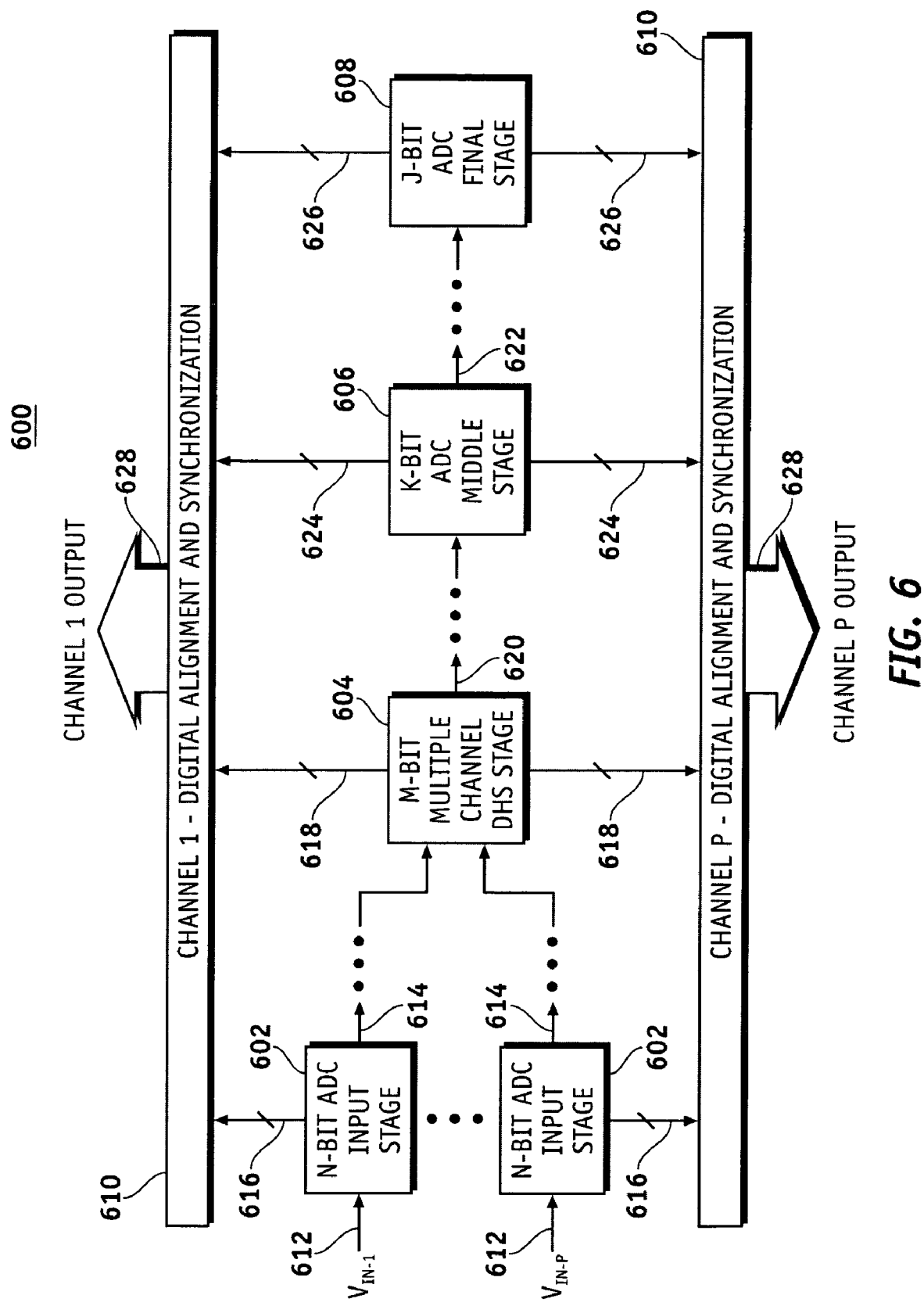
FIG. 6 is a schematic representation of a generalized pipelined ADC configured in accordance with an example embodiment of the invention.

FIG. 6 is a schematic representation of a generalized pipelined ADC 600 configured in accordance with an example embodiment of the invention. ADC 600 generally includes a plurality of separate input stages 602, a delay/holding and synchronization ("DHS") stage 604 coupled to input stages 602, at least one middle stage 606 coupled to DHS stage 604, and a final stage 608 coupled to the at least one middle stage 606. ADC 600 may also include an architecture or arrangement 610 configured to perform digital alignment, synchronization, and/or correction for the multiple channels supported by ADC 600. FIG. 6 depicts ADC 600 in a generalized manner that is intended to represent the flexible nature of ADC 600. In this regard, ADC 600 may include any number of separate input stages 602 that accommodate input voltage signals from up to P different channels. When no input stages 602 are utilized, DHS stage 604 serves as a "combined" first stage for the multiple channels. In addition, a given channel may utilize more than one input stage 602 in series, as indicated by the ellipses following the output of input stages 602. In other words, a given channel may include any number of input stages coupled in series before DHS stage 604. Similarly, although FIG. 6 depicts one middle stage 606, any number of middle stages can be utilized in a practical embodiment. Furthermore, final stage 608 is optional and need not be utilized in all practical embodiments. Indeed, a simple embodiment of the invention can be realized with input stages 602 and DHS stage 604 alone, without any middle stages 606 and without final stage 608.

ADC 600 and the various stages of ADC 600 need not process any specific number of bits, and the bit resolution of ADC 600 and the various stages of ADC 600 can be selected to suit the needs of the particular application. For example, an input stage 602 is suitably configured to process its respective analog input voltage signal and to generate an N-bit output corresponding to that input voltage signal. In practice, N can be any number (including zero if an input stage 602 is realized as a sample and hold stage rather than an ADC stage) and the actual number need not be the same for all input stages 602. Thus, the input stage 602 for one channel might generate two output bits per sample, while the input stage 602 for another channel might generate four output bits per sample. Similarly, the number of bits (1 through M) and number of channels that are processed by DHS stage 604 can be adjusted as needed for the given application, and the actual number of bits in the digital output for each channel need not be the same. Likewise, the number of bits (1 through K) and the number of channels that are processed by any middle stage 606 can be adjusted as needed for the given application, and the actual number of bits in the digital output for each channel need not be the same. Finally, the number of bits (1 through J) and the number of channels that are processed by final stage 608 can be adjusted as needed for the given application, and the actual number of bits in the digital output for each channel need not be the same. Notably, the variables N, M, K, and J mentioned above need not be correlated in any way.

ADC 600 is suitably configured such that a plurality of input voltage signals 612 are simultaneously sampled with distinct input stages 602. Thereafter, one of the samples is delayed by DHS stage 604, which processes both samples in an alternating manner. DHS stage 604 merges the input channels together, delays the sample streams from the input channels relative to one other, and (in some embodiments) processes the residual voltages from the input channels in sequential fashion. The use of input stages 602 reduces the accuracy requirements of DHS stage 604, which enables the practical use of DHS stage 604 in applications that require high precision. The use of separate input stages 602 also provides improved isolation between the multiple channels. Furthermore, as described in more detail below, DHS stage 604 is suitably configured to provide a balanced load to input stages 602, which is desirable to preserve signal integrity.

In a practical embodiment, input stages 602 are configured to concurrently sample a plurality of input voltage signals 612 every other clock phase, and to concurrently provide a plurality of voltage sample sequences 614, where the plurality of voltage sample sequences 614 are derived from the plurality of input voltage signals 612. If an input stage 602 is realized as a sample-and-hold stage, then the voltage sample sequence 614 will correspond to the sampled input voltage signal 612 and input stage 602 will not generate a digital output. If an input stage 602 is realized as an ADC stage (for example, a switched capacitor gain stage), then the voltage sample sequence 614 will typically include samples having voltage levels that are different than the voltage levels of the corresponding samples from input voltage signal 612. An ADC stage will also generate an N-bit digital output 616 for each channel in response to the respective input voltage signal. As depicted in FIG. 6, the digital outputs 616 are processed by architecture 610 for contribution to the multi-channel output data.

DHS stage 604 is coupled to the respective outputs of input stages 602 to receive voltage sample sequences 614 (or suitable sample sequences that are based upon or derived from voltage sample sequences 614). DHS stage 604 concurrently samples voltage sample sequences 614 to obtain a plurality of DHS voltage sample sequences. The DHS voltage sample sequences correspond to, or are derived from, the respective voltage sample sequences 614. In practical embodiments, the DHS voltage sample sequences are internally obtained and processed by DHS stage 604. As described in more detail below, DHS stage 604 is suitably configured to alternately process the DHS voltage sample sequences using a double sampling technique. In the example embodiments described herein, DHS stage 604 performs double sampled processing relative to input stages 602. DHS stage 604 is also configured to generate a plurality of M-bit digital outputs 618 corresponding to voltage sample sequences 614. As depicted in FIG. 6, the digital outputs 618 are processed by architecture 610 for contribution to the multi-channel output data.

DHS stage 604 is structured to provide a series or sequence of interleaved DHS voltage samples 620, where the interleaved DHS voltage samples 620 are derived from the DHS voltage sample sequences processed by DHS stage 604. Notably, DHS stage 604 staggers the DHS voltage sample sequences to generate a single output sequence. In the example embodiments described herein, DHS stage 604 alternates between two DHS voltage sample sequences to produce one double sampled output sequence, e.g., interleaved DHS voltage samples 620.

A middle stage 606 may be coupled to the respective output of DHS stage 604 to receive interleaved DHS voltage samples 620 (or a suitable sample sequence that is based upon or derived from interleaved DHS voltage samples 620). Middle stage 606 is suitably configured to sample the series of interleaved DHS voltage samples 620 on every clock phase. In a practical embodiment, middle stage 606 can employ conventional techniques and/or known double sampled switched capacitor gain stage architectures. For example, one suitable architecture is disclosed in U.S. Pat. No. 5,574,457 (this patent is incorporated by reference herein). Middle stage 606 also generates and provides a series of interleaved residual voltage samples 622 at its output. The series of interleaved residual voltage samples 622 correspond to, or are derived from, the series of interleaved DHS voltage samples 620, and the interleaved residual voltage samples are output on every clock phase. Middle stage 606 is also configured to generate a plurality of K-bit digital outputs 624 corresponding to the series of interleaved DHS voltage samples 620. Notably, the digital outputs 624 for the different channels are generated in an alternating fashion. As depicted in FIG. 6, the digital outputs 624 are processed by architecture 610 for contribution to the multi-channel output data.

As mentioned above, a practical embodiment of ADC 600 may employ any number of middle stages 606 coupled in series, wherein each middle stage 606 generates a series of interleaved residual voltage samples 622 for the next stage in ADC 600. In some embodiments, ADC 600 includes final stage 608 coupled to the output of a middle stage 606. In embodiments having no middle stages 606, ADC 600 may include final stage 608 coupled to the output of DHS stage 604. Actually, final stage 608 is optional and need not be employed in all practical embodiments. Assuming that middle stage 606 is present, final stage 608 is coupled to receive interleaved residual voltage samples 622 (or a suitable sample sequence that is based upon or derived from interleaved residual voltage samples 622). Final stage 608 is suitably configured to sample, process, and convert the series of interleaved residual voltage samples 622. In a practical embodiment, final stage 608 can employ conventional sampling, comparison, and flash analog-to-digital conversion techniques to convert the series of interleaved residual voltage samples 622 to digital format while concurrently generating any remaining output bits as necessary. In this regard, final stage 608 samples the series of interleaved residual voltage samples 622 and generates a plurality of J-bit digital outputs 626 corresponding to the series of interleaved residual voltage samples 622. Notably, the digital outputs 626 for the different channels are generated in an alternating fashion. As depicted in FIG. 6, the digital outputs 626 are processed by architecture 610 for contribution to the multi-channel output data.

Architecture 610 is designed to align and synchronize the various digital outputs from the pipeline stages to provide proper timing of the ultimate channel output data 628. In addition, architecture 610 may be configured to perform digital correction, bit consolidation, and/or other digital processing of the various digital outputs prior to generating the channel output data 628. In this regard, architecture 610 may leverage conventional digital correction logic employed by known ADC circuits. One suitable correction architecture is disclosed in U.S. Pat. No. 5,644,313 (this patent is incorporated by reference herein).

As explained above, the output voltages of multiple input stages may be received by DHS stage 604 for combined processing. FIG. 7 is a schematic representation of an example DHS stage 700 that can be utilized in ADC 600, and FIG. 8 is a diagram depicting the relative timing of example clock signals that influence the operation of DHS stage 700. Notably, DHS stage 700 is one practical implementation of the generalized switched-capacitor gain stage 500 described above. In this example, DHS stage 700 is configured to simultaneously sample two channel inputs, to delay the processing of one channel input, and to process the two channel inputs at a double sampling rate relative to the preceding input stages. In FIG. 8, the p1a, p2a, p1b, and p2b signals represent clock signals or clock phases that may be based upon or derived from the p1 and p2 clock signals. As described below, these clock signals govern the operation of DHS stage 700 to facilitate double sampling by DHS stage 700.

DHS stage 700 includes an input node 702 for receiving a first input voltage signal (e.g., a series or sequence of voltage samples generated by a first ADC input stage), an input node 704 for receiving a second input voltage signal (e.g., a series or sequence of voltage samples generated by a second ADC input stage), and an output node 706 for providing an output voltage signal (e.g., a series or sequence of interleaved DHS voltage samples). Although the input voltage signals can be from any suitable source, this example identifies the input voltage signals as VIN_I and VIN_Q to represent a practical embodiment that processes corresponding in-phase and quadrature signals. The series of interleaved DHS voltage samples is derived from the first and second input voltage signals and, more particularly, is derived from the first and second DHS voltage sample sequences that are internally generated by DHS stage 700. DHS stage 700 also includes a first reference node 708 for a first reference voltage $V_{REFP}$, and a second reference node 710 for a second reference voltage $V_{REFM}$. DHS stage 700 also includes first comparison and digital logic architecture 712 and a second comparison and digital logic architecture 714, each being configured to generate respective switch control signals and a digital output (having one to M bits in this example) for the two channels. For the sake of simplicity, the digital outputs are not shown in FIG. 7. First digital logic architecture 712 is coupled to input node 702, and second digital logic architecture 714 is coupled to input node 704.

The operation of DHS stage 700 will be summarized below with reference to the clock signals shown in FIG. 8. The switches in DHS stage 700 are controlled by the clock signals depicted in FIG. 8 and by the switch control signals generated by architectures 712/714. The switches in FIG. 7 are labeled with their respective governing clock/control signals. In this example, when a clock/control signal is high, the associated switch is closed, and when a clock/control signal is low, the associated switch is open. In FIG. 8, $t_1$ indicates the entire clock phase during which the p1 clock signal is low, the p2 clock signal is high, and the p2a clock signal is high. Likewise, the other time designators are intended to represent the respective clock phases (i.e., periods of time).

Beginning (arbitrarily) during time $t_1$, the p2 and p2a clock signals are high and the respective switches labeled p2 and p2a in FIG. 7 are closed. Concurrently, all remaining clock signals are low and all remaining switches are open. The logic high state of the p2a clock signal also enables a digital logic component 716 of architecture 714 (in contrast, the other digital logic components 718/720/722 remain disabled). The enabling of digital logic component 716 results in the generation of an appropriate switch control signal (h2q, l2q, or m2q) by digital logic component 716. During time $t_1$, a first switched capacitor arrangement 724 and a second switched capacitor arrangement 726 are controlled such that the $C_{1i}$ and the $C_{2i}$ capacitors charge to sample the VIN_I input voltage present at input node 702 and such that the $C_{1q}$ and the $C_{2q}$ capacitors charge to sample the VIN_Q input voltage present at input node 704. Also during time $t_1$, a fourth switched capacitor arrangement 730 is controlled such that the $C_{3q}$ and $C_{4q}$ capacitors are coupled to an amplifier 732, which generates an output voltage at output node 706. This output corresponds to a previously sampled VIN_Q input voltage stored by the $C_{3q}$ and $C_{4q}$ capacitors. In addition, since digital logic component 716 is enabled, either the h2q switch, the l2q switch, or the m2q switch is closed depending upon the comparison of the previously sampled VIN_Q input voltage relative to a high voltage reference (VH) and a low voltage reference (VL). The result of the comparison will impact the magnitude of the output voltage present at output node 706 in a manner similar to that described above for gain stage 100. In this regard, comparison and digital logic architecture 714 may utilize suitable delay elements to ensure that the current output voltage sample temporally corresponds to its respective input voltage sample (which was obtained during a previous clock phase). The result of the comparison also determines the bit values for the current digital output generated by architecture 714. In this example, architecture 714 generates the M-bit digital output for the Q channel corresponding to the current sample.

During a subsequent time $t_2$, the p1 and p1b clock signals are high and the respective switches labeled p1 and p1b in FIG. 7 are closed. Concurrently, all remaining clock signals are low and all remaining switches are open. The logic high state of the p1b clock signal also enables a digital logic component 718 of architecture 712 (in contrast, the other digital logic components 716/720/722 remain disabled). The enabling of digital logic component 718 results in the generation of an appropriate switch control signal (h1i, l1i, or m1i) by digital logic component 718. During time $t_2$, the VIN_I and VIN_Q input voltage signals are not sampled. Rather, first switched capacitor arrangement 724 is controlled such that the $C_{1i}$ and $C_{2i}$ capacitors are coupled to amplifier 732 to generate an output voltage at output node 706 corresponding to the previously sampled VIN_I input voltage stored by the $C_{1i}$ and $C_{2i}$ capacitors. In addition, since digital logic component 718 is enabled, either the h1i switch, the l1i switch, or the m1i switch is closed depending upon the comparison of the previously sampled VIN_I input voltage relative to the VH and VL reference voltages. The result of the comparison will impact the magnitude of the output voltage present at output node 706 in a manner similar to that described above for gain stage 100. In this regard, comparison and digital logic architecture 712 may utilize suitable delay elements to ensure that the current output voltage sample temporally corresponds to its respective input voltage sample (which, in this example, was obtained during the clock phase identified by $t_1$). The result of the comparison also determines the bit values for the current digital output generated by architecture 712. In this example, architecture 712 generates the M-bit digital output for the I channel corresponding to the current sample.

During a subsequent time $t_3$, the p2 and p2b clock signals are high and the respective switches labeled p2 and p2b in FIG. 7 are closed. Concurrently, all remaining clock signals are low and all remaining switches are open. The logic high state of the p2b clock signal also enables a digital logic component 720 of architecture 714 (in contrast, the other digital logic components 716/718/722 remain disabled). The enabling of digital logic component 720 results in the generation of an appropriate switch control signal (h1q, l1q, or m1q) by digital logic component 720. During time $t_3$, a third switched capacitor arrangement 728 and a fourth switched capacitor arrangement 730 are controlled such that the $C_{3i}$ and the $C_{4i}$ capacitors charge to sample the VIN_I input voltage present at input node 702 and such that the $C_{3q}$ and the $C_{4q}$ capacitors charge to sample the VIN_Q input voltage present at input node 704. Also during this time $t_3$, a second switched capacitor arrangement 726 is controlled such that the $C_{1q}$ and $C_{2q}$ capacitors are coupled to amplifier 732 to generate an output voltage at output node 706 corresponding to the previously sampled VIN_Q input voltage stored by the $C_{1q}$ and $C_{2q}$ capacitors. In addition, since digital logic component 720 is enabled, either the h1q switch, the l1q switch, or the m1q switch is closed depending upon the comparison of the previously sampled VIN_Q input voltage relative to the VH and VL reference voltages. The result of the comparison will impact the magnitude of the output voltage present at output node 706 in a manner similar to that described above for gain stage 100. In this regard, comparison and digital logic architecture 714 may utilize suitable delay elements to ensure that the current output voltage sample temporally corresponds to its respective input voltage sample (which, in this example, was obtained during the clock phase identified by $t_1$). The result of the comparison also determines the bit values for the current digital output generated by architecture 714. In this example, architecture 714 generates the M-bit digital output for the Q channel corresponding to the current sample.

During a subsequent time $t_4$, the p1 and p1a clock signals are high and the respective switches labeled p1 and p1a in FIG. 7 are closed. Concurrently, all remaining clock signals are low and all remaining switches are open. The logic high state of the p1a clock signal also enables a digital logic component 722 of architecture 712 (in contrast, the other digital logic components 716/718/720 remain disabled). The enabling of digital logic component 722 results in the generation of an appropriate switch control signal (h2$i$, l2$i$, or m2$i$) by digital logic component 722. During time $t_4$, the VIN_I and VIN_Q input voltage signals are not sampled. Rather, third switched capacitor arrangement 728 is controlled such that the $C_{3i}$ and $C_{4i}$ capacitors are coupled to amplifier 732 to generate an output voltage at output node 706 corresponding to the previously sampled VIN_I input voltage stored by the $C_{3i}$ and $C_{4i}$ capacitors. In addition, since digital logic component 722 is enabled, either the h2$i$ switch, the l2$i$ switch, or the m2$i$ switch is closed depending upon the comparison of the previously sampled VIN_I input voltage relative to the VH and VL reference voltages. The result of the comparison will impact the magnitude of the output voltage present at output node 706 in a manner similar to that described above for gain stage 100. In this regard, comparison and digital logic architecture 712 may utilize suitable delay elements to ensure that the current output voltage sample temporally corresponds to its respective input voltage sample (which, in this example, was obtained during the clock phase identified by $t_3$). The result of the comparison also determines the bit values for the current digital output generated by architecture 712. In this example, architecture 712 generates the M-bit digital output for the I channel corresponding to the current sample.

The clock phase identified by $t_5$ represents the beginning of another iteration of the procedure described above, i.e., the state of the clock signals during time $t_5$ is equivalent to the state of the clock signals during time $t_1$. Thus, the two input signals are again sampled while the output voltage will be based upon the voltages sampled by the $C_{3q}$ and $C_{4q}$ capacitors during time $t_3$. In the context of DHS stage 700, the two input voltage signals VIN_I and VIN_Q are concurrently sampled every other phase of the p2 clock signal. As used herein, the sampled input voltage sequences are referred to as DHS voltage sample sequences, which are internally produced and processed by DHS stage 700. In practice, the DHS voltage samples may be considered to be the voltages stored in the various capacitor arrangements described above. As described above, these DHS voltage samples are alternately processed to generate a series of interleaved DHS voltage samples at output node 706 on every clock phase (relative to the p1 clock signal or the p2 clock signal). In other words, although the two input voltage signals are concurrently sampled, processing of one of the two input channels is delayed to facilitate the generation of the double sampled output using only one amplifier 732. The digital outputs generated by architectures 712/714 are also alternately processed.

In an alternate embodiment, the comparators and digital logic components of DHS stage 700 can be configured to run at twice the normal clock rate (e.g., there could be two clock rates and the comparator clock rate would be twice as fast as the gain stage clock rates). In this alternate configuration, only one set of comparators and logic need be employed for DHS stage 700. One suitable technique that can be utilized in this context is disclosed in U.S. Pat. No. 6,535,157 (this patent is incorporated by reference herein).

In summary, systems, devices, and methods configured in accordance with example embodiments of the invention relate to:

A switched-capacitor gain stage comprising a plurality of input nodes for a plurality of input voltage signals, an amplifier having an amplifier input node and an amplifier output node, a plurality of switched-capacitor arrangements, each being coupled between one of the input nodes and the amplifier input node such that each of the input nodes is coupled to a like number of the switched-capacitor arrangements, and a switch architecture configured to cause the switched-capacitor gain stage to concurrently sample the input voltage signals, and to provide, at the amplifier output node, a series of interleaved output voltage samples derived from the input voltage signals. Each of the switched-capacitor arrangements may comprise a first capacitor having a first input end and a first output end, and a second capacitor having a second input end and a second output end connected to the first output end of the first capacitor, wherein the switch architecture is configured to connect the first input end and the second input end to a respective one of the input nodes, and to connect the first output end and the second output end to a reference potential for input voltage signal sampling. The reference potential may be a ground. At least one of the switched-capacitor arrangements may comprise a programmable capacitance. Each of the switched-capacitor arrangements may comprise two capacitors having equal capacitance. Input loading at each of the input nodes is balanced. Each of the switched capacitor arrangements may comprise a first capacitor having a first output end, and a second capacitor having a second input end and a second output end connected to the first output end of the first capacitor, wherein the switch architecture is configured to connect the first capacitor between the amplifier input node and the amplifier output node, to connect the second output end to the amplifier input node, and to connect the second input end to a reference voltage for output voltage generation. The reference voltage may be a programmable voltage value. The reference voltage may be selectable between a positive reference voltage value, zero, and a negative reference voltage value. The switched-capacitor gain stage may further comprise a plurality of comparison and digital logic architectures, each being coupled to a respective input node to receive a respective input voltage signal, and each being configured to generate a respective digital output corresponding to the respective input voltage signal.

A switched-capacitor gain stage comprising an amplifier having an amplifier input node and an amplifier output node, a first switched-capacitor arrangement having an input node for receiving a first input voltage signal, an output node coupled to the amplifier output node, and a feedback node coupled to the amplifier input node, a second switched-capacitor arrangement having an input node for receiving a second input voltage signal, an output node coupled to the amplifier output node, and a feedback node coupled to the amplifier input node, a third switched-capacitor arrangement having an input node for receiving the first input voltage signal, an output node coupled to the amplifier output node, and a feedback node coupled to the amplifier input node, a fourth switched-capacitor arrangement having an input node for receiving the second input voltage signal, an output node coupled to the amplifier output node, and a feedback node coupled to the amplifier input node, and a switch architecture configured to cause the switched-capacitor gain stage to concurrently sample the first input signal and the second input signal, and to provide, at the amplifier output node, a series of interleaved output voltage samples derived from the first input voltage signal and the second input voltage signal. Each of the switched-capacitor arrangements may comprise a first capacitor having a first input end and a first output end, and a second capacitor having a second input end and a second output end connected to the first output end of the first capacitor, wherein the switch architecture is configured to connect the first input end and the second input end to a respective one of the input nodes, and to connect the first output end and the second output end to a reference potential for input voltage signal sampling. Each of the switched capacitor arrangements may comprise a first capacitor having a first output end, and a second capacitor having a second input end and a second output end connected to the first output end of the first capacitor, wherein the switch architecture is configured to connect the first capacitor between the amplifier input node and the amplifier output node, to connect the second output end to the amplifier input node, and to connect the second input end to a reference voltage for output voltage generation. The switched-capacitor gain stage may further comprise a first comparison and digital logic architecture coupled to the input node of the first switched-capacitor arrangement and to the input node of the third switched-capacitor arrangement, the first comparison and digital logic architecture being configured to receive the first input voltage signal and to generate a first digital output corresponding to the first input voltage signal, and a second comparison and digital logic architecture coupled to the input node of the second switched-capacitor arrangement and to the input node of the fourth switched-capacitor arrangement, the second comparison and digital logic architecture being configured to receive the second input voltage signal and to generate a second digital output corresponding to the second input voltage signal. The switch architecture may be configured to perform switching at a first time, including switching the first switched-capacitor arrangement to sample the first input voltage signal, switching the second switched-capacitor arrangement to sample the second input voltage signal, switching the third switched-capacitor arrangement to hold its previously-sampled voltage, and switching the fourth switched-capacitor arrangement for coupling to the amplifier and to a selectable reference voltage for output voltage generation.

A method of operating a switched-capacitor gain stage having a first input node, a second input node, an amplifier, first, second, third, and fourth switched-capacitor arrangements, and a switch architecture for selectively coupling the first, second, third, and fourth switched-capacitor arrangements to the first input node, the second input node, and the amplifier, the method comprising at a first time, switching the first switched-capacitor arrangement and the second switched-capacitor arrangement to sample a first input voltage signal present at the first input node and a second input voltage signal present at the second input node, respectively, switching the third switched-capacitor arrangement to hold its previously-sampled voltage, and switching the fourth switched-capacitor arrangement for coupling to the amplifier and a selectable reference voltage for output voltage generation. Switching the fourth switched-capacitor arrangement at the first time provides an amplifier output voltage based upon a past-sampled voltage stored by the fourth switched-capacitor arrangement, and based upon the selectable reference voltage. The method may further comprise at a second time subsequent to the first time, switching the first switched-capacitor arrangement for coupling to the amplifier and the selectable reference voltage for output voltage generation, switching the second switched-capacitor arrangement to hold its previously-sampled voltage, switching the third switched-capacitor arrangement to hold its previously-sampled voltage, and switching the fourth switched-capacitor arrangement to hold its previously-sampled voltage. The method may further comprise at a third time subsequent to the second time, switching the first switched-capacitor arrangement to hold its previously-sampled voltage, switching the second switched-capacitor arrangement for coupling to the amplifier and the selectable reference voltage for output voltage generation, and switching the third switched-capacitor arrangement and the fourth switched-capacitor arrangement to sample the first input voltage signal present at the first input node and the second input voltage present at the second input node, respectively. The method may further comprise at a fourth time subsequent to the third time, switching the first switched-capacitor arrangement to hold its previously-sampled voltage, switching the second switched-capacitor arrangement to hold its previously-sampled voltage, switching the third switched-capacitor arrangement for coupling to the amplifier and the selectable reference voltage for output voltage generation, and switching the fourth switched-capacitor arrangement to hold its previously-sampled voltage.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A switched-capacitor gain stage comprising:
an amplifier having an amplifier input node and an amplifier output node;
a first switched-capacitor arrangement having an input node for receiving a first input voltage signal, an output node coupled to said amplifier output node, and a feedback node coupled to said amplifier input node;
a second switched-capacitor arrangement having an input node for receiving a second input voltage signal, an output node coupled to said amplifier output node, and a feedback node coupled to said amplifier input node;
a third switched-capacitor arrangement having an input node for receiving said first input voltage signal, an output node coupled to said amplifier output node, and a feedback node coupled to said amplifier input node;
a fourth switched-capacitor arrangement having an input node for receiving said second input voltage signal, an output node coupled to said amplifier output node, and a feedback node coupled to said amplifier input node; and
a switch architecture configured to cause said switched-capacitor gain stage to concurrently sample said first input signal and said second input signal, and to provide, at said amplifier output node, a series of interleaved output voltage samples derived from said first input voltage signal and said second input voltage signal.

2. A switched-capacitor gain stage according to claim 1, each of said switched-capacitor arrangements comprising:
a first capacitor having a first input end and a first output end; and
a second capacitor having a second input end and a second output end connected to said first output end of said first capacitor; wherein
said switch architecture is configured to connect said first input end and said second input end to a respective one of said input nodes, and to connect said first output end and said second output end to a reference potential for input voltage signal sampling.

3. A switched-capacitor gain stage according to claim 1, each of said switched capacitor arrangements comprising:
a first capacitor having a first output end; and
a second capacitor having a second input end and a second output end connected to said first output end of said first capacitor; wherein
said switch architecture is configured to connect said first capacitor between said amplifier input node and said amplifier output node, to connect said second output end to said amplifier input node, and to connect said second input end to a reference voltage for output voltage generation.

4. A switched-capacitor gain stage according to claim 1, further comprising:
a first comparison and digital logic architecture coupled to said input node of said first switched-capacitor arrangement and to said input node of said third switched-capacitor arrangement, said first comparison and digital logic architecture being configured to receive said first input voltage signal and to generate a first digital output corresponding to said first input voltage signal; and
a second comparison and digital logic architecture coupled to said input node of said second switched-capacitor arrangement and to said input node of said fourth switched-capacitor arrangement, said second comparison and digital logic architecture being configured to receive said second input voltage signal and to generate a second digital output corresponding to said second input voltage signal.

5. A switched-capacitor gain stage according to claim 1, said switch architecture being configured to perform switching at a first time, comprising:
switching said first switched-capacitor arrangement to sample said first input voltage signal;
switching said second switched-capacitor arrangement to sample said second input voltage signal;
switching said third switched-capacitor arrangement to hold its previously-sampled voltage; and
switching said fourth switched-capacitor arrangement for coupling to said amplifier and to a selectable reference voltage for output voltage generation.

6. A method of operating a switched-capacitor gain stage having a first input node, a second input node, an amplifier, first, second, third, and fourth switched-capacitor arrangements, and a switch architecture for selectively coupling the first, second, third, and fourth switched-capacitor arrangements to the first input node, the second input node, and the amplifier, said method comprising:
at a first time, switching the first switched-capacitor arrangement and the second switched-capacitor arrangement to sample a first input voltage signal present at the first input node and a second input voltage signal present at the second input node, respectively, switching the third switched-capacitor arrangement to hold its previously-sampled voltage, and switching the fourth switched-capacitor arrangement for coupling to the amplifier and a selectable reference voltage for output voltage generation.

7. A method according to claim 6, wherein switching the fourth switched-capacitor arrangement at said first time provides an amplifier output voltage based upon a past-sampled voltage stored by the fourth switched-capacitor arrangement, and based upon said selectable reference voltage.

8. A method according to claim 6, further comprising:
at a second time subsequent to said first time, switching the first switched-capacitor arrangement for coupling to the amplifier and said selectable reference voltage for output voltage generation, switching the second switched-capacitor arrangement to hold its previously-sampled voltage, switching the third switched-capacitor arrangement to hold its previously-sampled voltage, and switching the fourth switched-capacitor arrangement to hold its previously-sampled voltage.

9. A method according to claim 8, further comprising:
at a third time subsequent to said second time, switching the first switched-capacitor arrangement to hold its previously-sampled voltage, switching the second switched-capacitor arrangement for coupling to the amplifier and said selectable reference voltage for output voltage generation, and switching the third switched-capacitor arrangement and the fourth switched-capacitor arrangement to sample said first input voltage signal present at the first input node and said second input voltage present at the second input node, respectively.

10. A method according to claim 9, further comprising:
at a fourth time subsequent to said third time, switching the first switched-capacitor arrangement to hold its previously-sampled voltage, switching the second switched-capacitor arrangement to hold its previously-sampled voltage, switching the third switched-capacitor arrangement for coupling to the amplifier and said selectable reference voltage for output voltage generation, and switching the fourth switched-capacitor arrangement to hold its previously-sampled voltage.

* * * * *